United States Patent [19]

Liu et al.

[11] Patent Number: 5,621,321

[45] Date of Patent: Apr. 15, 1997

[54] MAGNETIC RESONANCE SCAN CALIBRATION METHOD FOR ULTRA-FAST IMAGE ACQUISITION

[75] Inventors: Haiying Liu, Euclid; Rao P. Gullapalli; Mark J. Loncar, both of Richmond Heights; Gordon D. DeMeester, Wickliffe, all of Ohio

[73] Assignee: Picker International, Inc., Highland Heights, Ohio

[21] Appl. No.: 553,849

[22] Filed: Nov. 6, 1995

[51] Int. Cl.$^6$ .................................................... G01V 3/00
[52] U.S. Cl. ............................................ 324/309; 324/307
[58] Field of Search .................................. 324/300, 307, 324/309, 306, 312, 314

[56] References Cited

U.S. PATENT DOCUMENTS

| | | | |
|---|---|---|---|
| 5,151,656 | 9/1992 | Maier et al. | 324/309 |
| 5,341,099 | 8/1994 | Suzuki | 324/309 |
| 5,432,447 | 7/1995 | Song | 324/309 |
| 5,510,711 | 4/1996 | Molyneaux et al. | 324/309 |

OTHER PUBLICATIONS

"Interleaved Echo Planar Imaging on a Standard MRI System", Butts, et al. MRM 31:67–72 (1994).
"Ultrafast Interleaved Gradient–Echo–Planar Imaging on a Standard Scanner", McKinnon, MRM 30:609–616 (1993).

Primary Examiner—Louis M. Arana
Attorney, Agent, or Firm—Fay, Sharpe, Beall, Fagan, Minnich & McKee

[57] ABSTRACT

A sequence control (40) causes a transmitter (24) and gradient amplifiers (20) to transmit appropriate radio frequency excitation and other pulses to induce magnetic resonance in selected dipoles and cause the magnetic resonance to be refocused into a series of echoes following each excitation. A receiver (38) converts each echo into a digital data line. Each data line is regridded (70) for uniformity in k-space (FIG. 4). The data lines are one-dimensionally Fourier transformed (72) in a frequency encode direction. The one-dimensionally Fourier transformed data lines are multiplied (80) with a phase correction vector. A phase correction vector determining system (82) determines a corresponding phase correction vector for each echo number or position following excitation from a series of calibration echoes. To compensate for a decrease in magnitude with echo position following excitation, the intensity of each data line is scaled (90) to a common magnitude. The intensity corrected data lines are stored in a memory (96) and one-dimensionally Fourier transformed in a phase encode direction into an image memory (100). A monitor (104) converts the image memory representation into a human-readable display.

21 Claims, 5 Drawing Sheets

MAGNETIC RESONANCE SCAN CALIBRATION METHOD FOR ULTRA-FAST IMAGE ACQUISITION

BACKGROUND OF THE INVENTION

The present invention relates to the magnetic resonance arts. It finds particular application in conjunction with echo-planar imaging (EPI) and echo-volume imaging (EVI) and will be described with particular reference thereto. However, it is to be appreciated that the present technique is also applicable to other rapid imaging sequences with repeated gradient echoes, spin echoes, or combinations of gradient and spin echoes, such as fast spin echo (FSE) techniques and gradient and spin echo (GSE) techniques.

Heretofore, magnetic resonance imaging subjects have been positioned in a temporally constant magnetic field such that selected dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

To strengthen the magnetic resonance signals, the resonance signal is commonly refocused into an echo. Reversing the polarity of a magnetic field gradient induces a field or gradient echo. Analogously, following the radio frequency excitation pulse with a 180° refocusing pulse causes the resonating spin system to refocus as a spin echo. Moreover, by repeating the reversing of the magnetic field gradient, a series of gradient echoes can be generated following each radio frequency excitation pulse. Analogously, a series of spin echoes can be generated following each radio frequency excitation pulse by repeating the 180° radio frequency refocusing pulse. As yet another option, a single radio frequency excitation pulse can be followed by a mixture of spin and gradient echoes. See, for example U.S. Pat. No. 4,833,408 of Holland, et al.

In a two-dimensional Fourier transform imaging technique, a read gradient is applied during the read out of the echo for frequency encoding along a read axis and a phase encode gradient is pulsed to step phase encoding along a phase encode axis between echoes. In this manner, each echo generates a data line in k-space. The relative phase encoding of the data lines controls their relative position in k-space. Conventionally, the data line with zero phase encoding extends across the center of k-space. Data lines with a phase encoding gradient stepped in progressively positive steps are generally depicted as being above the center line of k-space; and, data lines with progressively negative phase encoding steps are depicted as being below the center line of k-space. In this manner, a matrix, such as a 256×256 or a 512×512, etc., matrix of data values in k-space is generated. Fourier transformation of these values generates a conventional magnetic resonance image.

After a single RF excitation, an entire set (e.g., 64, 128, or 256) of data lines can be generated following, i.e., a single shot technique. Of course, the magnetic resonance signal decays with time, becoming weaker in each echo. Further, the RF phase tends to shift inconsistently from view to view. Another disadvantage of single shot techniques, particularly single shot echo planar imaging, is the geometric distortion caused by field inhomogeneity due to the intrinsic low data sampling bandwidth along the phase encoding direction. The low sampling bandwidth also causes a significant chemical shift artifact. Stronger signals have been acquired and errors have been reduced by acquiring only a fraction, e.g., a quarter, of the data lines following each radio frequency excitation, i.e., a multiple shot technique.

In order to smooth out the phase and intensity discontinuities of the data, a sliding window can be used to window the data collection. See, "Interleaved Echo-Planar Imaging On a Standard MRI System", K. Butts, et al., MRM 31:67–72 (1994). The sliding window technique improves the image quality by moving the data sampling window from shot to shot. This effectively smooths out the intensity discontinuities between data lines. However, it increases the complexity of the imaging system and still leaves some high order phase discontinuity uncorrected. A combination of global and first order phase corrections is only effective for near perfect cases. This low order phase correction fails quickly as the system shifts off calibration.

The present invention is directed to a new and improved data acquisition technique which overcomes the above-referenced problems and others.

SUMMARY OF THE INVENTION

In accordance with one aspect of the present invention, a magnetic resonance imaging system is provided. A magnet generates a temporally constant magnetic field through an examination region. A radio frequency pulse controller and digital transmitter induce dipoles in the examination region to resonance such that radio frequency resonance signals are generated. Gradient magnetic field coils and a gradient magnetic field controller generate at least phase and read magnetic field gradient pulses in orthogonal directions to each other across the examination region and repeatedly reverse the read gradient. A receiver receives and demodulates the radio frequency magnetic resonance signals after each reversal of the read gradient to produce a series of data lines. An image memory stores a reconstructed image representation. A regridding processor adjusts each data line for uniformity in a read or frequency encode direction of k-space. A first array processor performs a one-dimensional Fourier transform in the read direction on each regridded data line. A phase correction vector multiplier multiplies each Fourier transform data line with a phase correction vector. A second array processor Fourier transforms the phase corrected data lines in a phase-encode direction into the image memory.

In accordance with a more limited aspect of the present invention, an intensity correction processor adjusts an amplitude of each phase corrected data line.

In accordance with another aspect of the present invention, a method of magnetic resonance imaging is provided. A radio frequency excitation pulse excites magnetic resonance in selected dipoles. The induced resonance is caused to form a plurality of echoes following each excitation. The echoes are read out along the first axis in the presence of a read gradient. Each magnetic resonance echo is digitized and demodulated to form a digital data line for reconstruction into an image representation in an image memory. Each data line is adjusted for uniformity in a frequency encode direction of k-space and is one-dimensionally Fourier transformed in the frequency encode direction. Each data line is multiplied with a phase correction vector and loaded into a data line memory. The data from the data line memory is Fourier transformed in a phase encode direction into the image memory.

In accordance with a more limited aspect of the present invention, the phase correction vector is determined from a series of calibration echoes which are generated by applying a radio frequency excitation pulse to induce resonance and causing the magnetic resonance to reform into the plurality of calibration echoes for all slices for 2D, or all volumes for 3D. The calibration echoes are filtered and Fourier transformed and normalized to generate a unit vector. A complex conjugate of each unit vector is determined for use as the phase correction vector. The phase correction vectors are stored in a memory.

In accordance with another aspect of the present invention, the number of data values in each calibration data line is reduced such that each complex conjugate vector has a reduced number of data values. Prior to the phase vector multiplying step, the complex conjugate vectors are expanded such that the number of data values in the phase correction vector and the data line match.

In accordance with another aspect of the present invention, the calibration sequence is repeated a plurality of times. The signal-to-noise ratio of each data line of each repetition is determined. From the average and distribution of the signal-to-noise ratios by echo position or number, the calibration data lines are statistically analyzed to determine a confidence value that the calibration sequence has been run a sufficient number of times. When the confidence level reaches a preselected level, repetition of the calibration sequence is terminated.

In accordance with another aspect of the present invention, the magnitude of the phase corrected data lines is adjusted. More specifically, a set of each phase corrected complex data line is stored. As data lines of each segment are received, a prediction of the next phase encoded data line is made with a prediction algorithm. The magnitude of the next phase corrected data line is corrected or adjusted in accordance with the predicted magnitude. The actual magnitude of the next data line is then determined and compared with the predicted value. Based on the difference between the predicted and actual magnitude, the prediction algorithm is adjusted.

One advantage of the present invention is that it facilitates the setup and acquisition of multiple shot multiple echo imaging techniques.

Another advantage of the present invention is that it enables multiple echo imaging techniques to be used with conventional gradient hardware and clinical imaging systems.

Another advantage of the present invention resides in its high spatial resolution and signal-to-noise ratio.

Another advantage of the present invention resides in its high image quality as a result of high order phase correction.

Another advantage of the present technique is that it reduces computer memory demand for calibration data.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
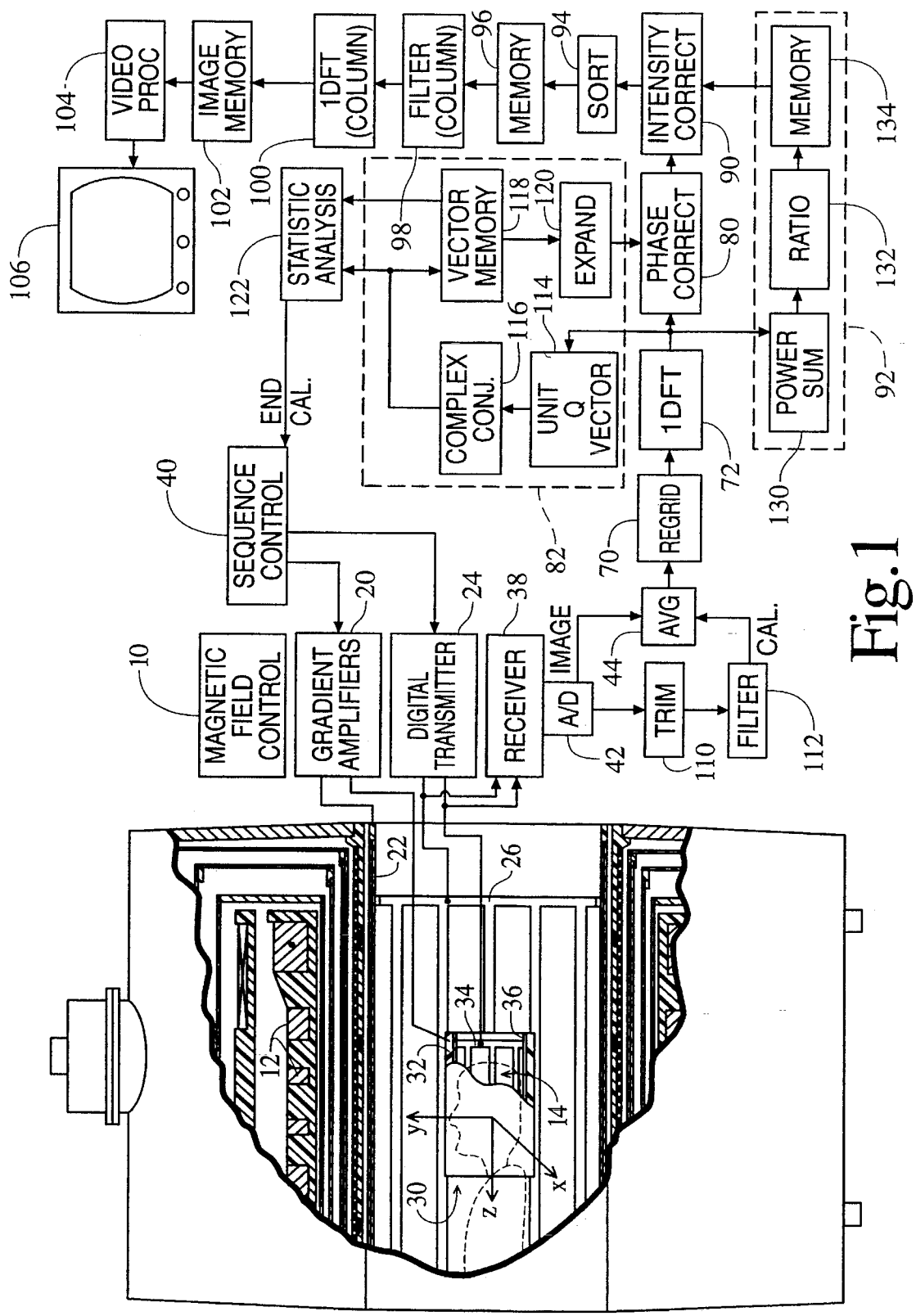
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38, preferably a digital receiver.

A sequence control circuit 40 controls the gradient pulse amplifiers 20 and the transmitter 24 to generate any of a plurality of multiple echo sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter disposed between the radio frequency receiving coil and the receiver for digital receivers and downstream from an analog receiver. For better image quality, each data line can be generated a plurality of times and averaged by an averaging circuit 44.

Figure 2:
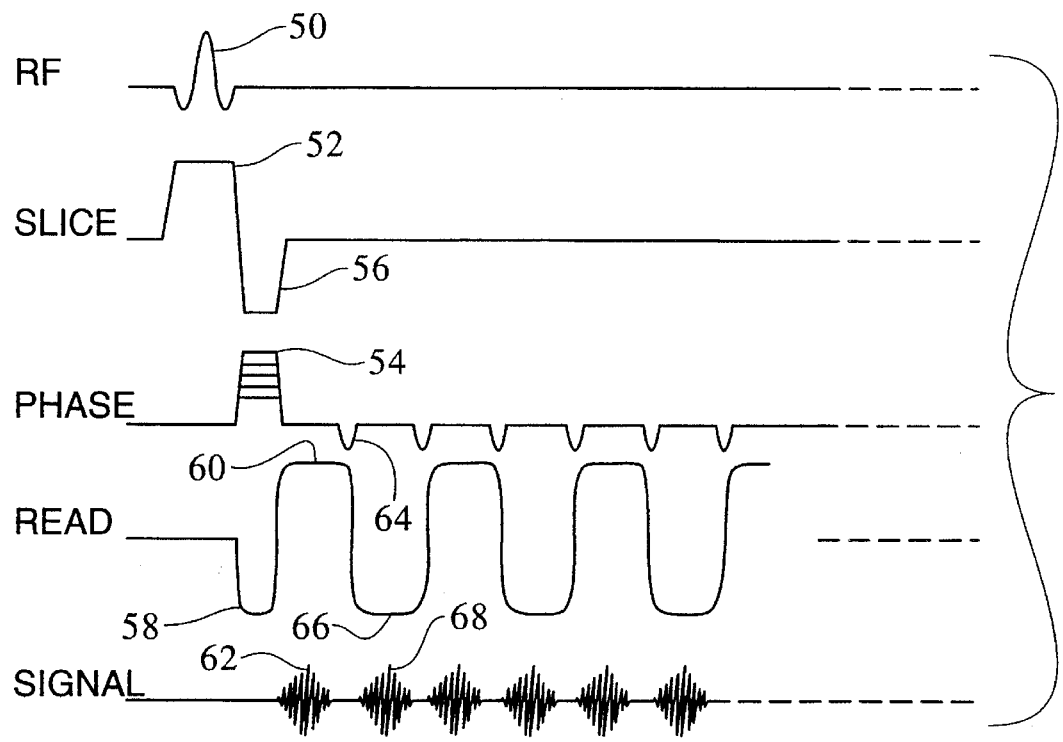
FIG. 2 illustrates an echo-planar imaging sequence.

With reference to FIG. 2, a multiple shot echo-planar imaging sequence is shown for purposes of illustration. A radio frequency pulse 50 is applied concurrently with a slice select gradient 52 to excite resonance in a single slice of the subject. A phase encode gradient 54, a reverse polarity portion 56 of the slice select gradient and a reverse polarity portion 58 of read gradient are applied concurrently. The read gradient reverses rapidly or oscillates. In particular, the read gradient has a second or positive portion 60 that is substantially twice the length of the reversed polarity portion 58. A gradient echo 62 occurs during the read gradient portion 60, with the center of the echo being at the point where the area under the read gradient pulse 60 equals the area under the reversed gradient pulse 58. After this equality point, magnetic resonance components commence to dephase. A phase encode gradient component 64 is applied as the read gradient is reversed to produce an opposite polarity portion 66. An additional gradient echo 68 is induced with its center at the point at which the area under read gradient pulse 66 equals the area between the echo center point of the read gradient 60 and the end of the read gradient 60. This process of oscillating the read gradient and pulsing the phase-encode gradient is repeated a multiplicity of times.

Figure 3:
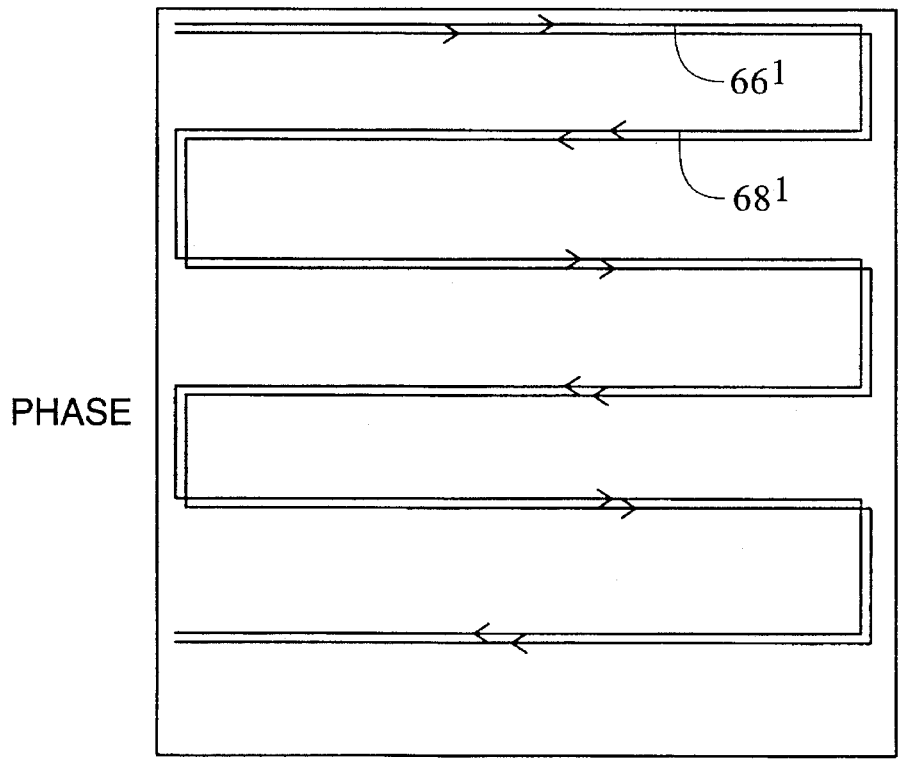
FIG. 3 illustrates how the echoes of the echo-planar imaging sequence of FIG. 2 fill k-space.

With reference to FIG. 3, each echo forms one of a plurality of data lines in k-space. In the illustrated embodiment, echo 62 produces a resonance signal that is converted by the receiver and analog-to-digital converter into a data line 62'. Analogously, echo 68 results in data line 68'. In the illustrated embodiment, four echoes are illustrated which produce four corresponding data lines each offset by a sixth of k-space. In this embodiment, each of the phase encode pulses 64 is sized to step the next grade data line a sixth of the way through k-space. Four echoes are illustrated for simplicity of illustration. Preferably, a larger number of echoes such as 8, 16, 24, 32, 64, etc., are generated following each radio frequency excitation pulse.

Figure 4:
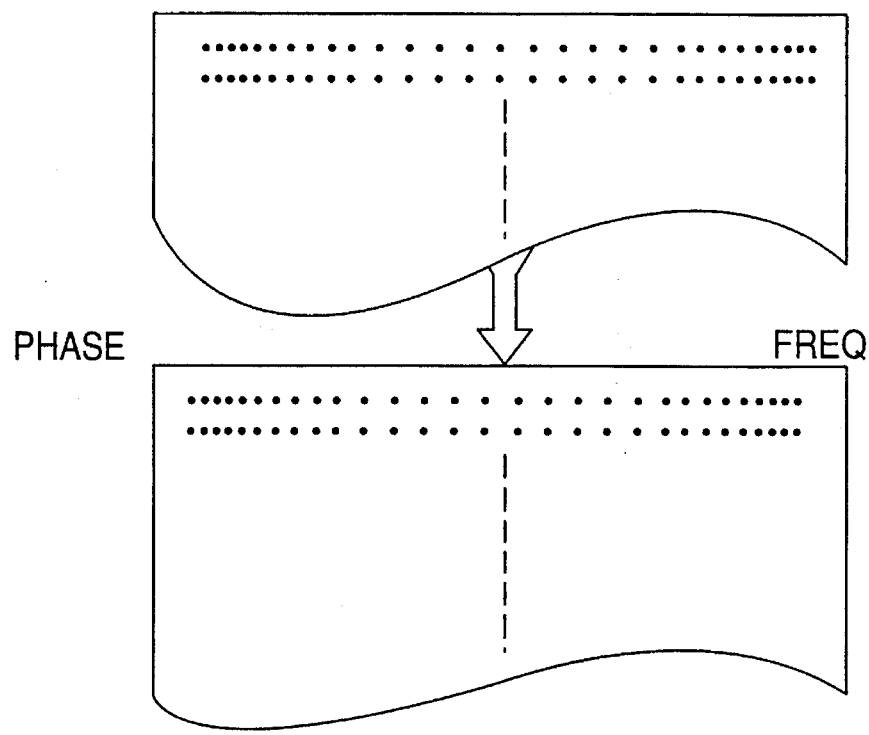
FIG. 4 illustrates the non-uniformity of data spacing within the data lines of k-space due to non-constant read gradient.

With reference to FIG. 4, each data line is digitized into a discrete number of digital data values, e.g., 256, 512, etc. Ideally, these values are equally spaced in k-space. However, the spacing of the data values is dependent on the magnetic gradient field strength of the read gradient pulses 64, 66, etc. In the real world, the read gradient tends to be lower at the edges of the echo and higher in the center as a result of the gradient slew rate limitation.

With reference again to FIG. 1, a regridding circuit 70 interpolates to make the spacing of the data values consistent in k-space. An array processor 72 performs a one-dimensional Fourier transform on each data line as it is received.

Figure 5:
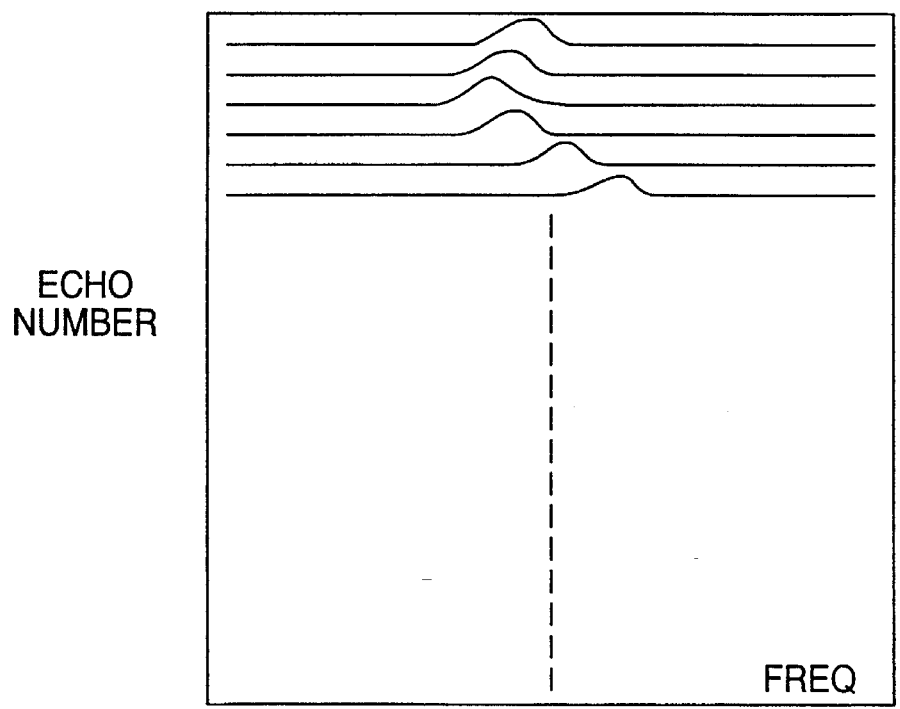
FIG. 5 illustrates the inherent time shifts and phase mismatches of the data lines without phase encode gradient.

With reference to FIG. 5, the multi-echo techniques inherently have a phase mismatch and time shift problem from data line to data line. When a series of data lines are run at each of the echo positions, with a common phase encoding, the center or peak point of their amplitude shifts. For example, a series of zero phase encoding data lines corresponding to each of the multiplicity of echoes have their amplitudes staggered as illustrated in FIG. 5 due to the inherent phase mismatches. A phase correction circuit 80 of FIG. 1 operates on each data line with a corresponding phase correction determined from a calibration sequence. More specifically, each data line is multiplied with a complex correction vector which normalizes or standardizes the phase angle of each component. The phase error correction vector is retrieved on an echo slice position by echo slice position basis from a phase correction vector subsystem 82.

After each data line is phase corrected, an intensity correction processor 90 normalizes or standardizes the echo-to-echo intensity. As described above, after each shot, the intensity of each echo is smaller than the preceding echo for a field echo EPI. A magnitude correction circuit 92 determines an appropriate amplitude correction for each echo in the series and the intensity correction circuit 90 adjusts the amplitude of each data line correspondingly.

Because the data lines are not collected in order, a sorting routine 94 sorts the data lines by their phase encode position in k-space and stores them in a memory 96. A filter 98 retrieves and filters columns of data from the memory 96 in a direction orthogonal to the one-dimensional Fourier transform performed by the first array processor 72, particularly in the phase-encode direction. A second array processor 100 performs a one-dimensional Fourier transform on the filtered data. The Fourier transformed data lines are stored in an image memory 102. Preferably, the above-described sequence is repeated for each of a plurality of parallel slices to generate a volume image representation that is stored in the image memory 102. Alternately, the data lines can be phase-encoded in a second dimension as well and processed with a volumetric reconstruction algorithm including a third array processor for performing another Fourier transform orthogonal to the first and second Fourier transform directions. A video processor 104 retrieves selected portions of the reconstructed image representation, such as individual slices, oblique slices, surface renderings, and images in other display formats as are known in the art and formats them for appropriate display on a human-readable monitor 106.

In the preferred embodiment, the calibration vector deriving circuit 82 causes the sequence control circuit 40 to run a calibration sequence in which the radio frequency excitation pulse is followed with a multi-echo sequence with the same number of echoes and slices as the imaging sequence, but with zero phase encoding. In the calibration sequence, a filter or trimming circuit 110 attenuates or trims off the ends of the data line, keeping only the central data values. In the preferred embodiment, the central half of the data is retained with the leading and trailing quarters trimmed off. A smoothing filter 112 smooths the trimmed data to reduce the noise contribution. Optionally, the trimming and smoothing functions can be combined into a single filter function. The trimmed calibration data is averaged 44, regridded using the regridding circuit 70, and one-dimensionally Fourier transformed using the first array processor 72.

A unit phase vector processor 114 calculates a unitary complex vector for each averaged line of calibration data. For example, each data line is divided by its magnitude to create the unit complex vector. A complex conjugate circuit 116 determines the complex conjugate of each unit vector. A phase correction memory 118 stores each of the complex conjugates in accordance with echo and slice number. As each line of image data is received by the phase correction circuit 80, the complex conjugate phase correction vector for the same echo and slice number is retrieved from the memory 118, interpolated 120 to the length of the data lines, and the two are multiplied 80.

In order to assure that calibration data is accurate, the calibration procedure is run a plurality of times. The averaging circuit 44 averages the results for each echo number. A statistical analysis circuit 122 compares the complex conjugate value for each echo number with an average and distribution from the phase correction complex conjugate memory 118 and performs a statistical analysis to determine the number of repetitions to be performed to have a preselected level of confidence in the accuracy of the phase correction process. As described in greater detail below, the statistical analysis circuit measures the signal-to-noise ratio, determines a deviation of the signal-to-noise of each current echo with the historical signal-to-noise ratio for the same number echo. From the deviation, a level of confidence in the accuracy of the average is determined. When the level of confidence for all echo numbers reaches the preselected minimum value, the statistical analysis circuit 122 terminates the calibration procedure.

In an alternate embodiment, a plurality of calibration data lines are again taken. However, rather than generating all of the calibration data lines with zero phase encoding data lines for a full set of echoes are taken with each of a plurality of phase encodings. The phase encodings are near the center of k-space. That is, the calibration data lines have low, near zero, phase encoding angles or steps, generally in the central quarter of k-space.

In the preferred embodiment, the intensity correction circuit 92 multiplies each phase corrected data line by a ratio obtained from the calibration data. A power summation circuit 130 calculates a power sum for a data line with each of the calibration echoes with zero phase encoding gradient. A ratio circuit 132 determines a ratio of each of the power sums to a preselected standard, preferably, the central data line of k-space with zero phase encoding. These complex data ratios are stored in a data memory 134. Thereafter, as each phase corrected imaging data line is passed to the intensity correction circuit 90, the ratio for the corresponding echo number is retrieved from the memory 134 and multiplied by the phase corrected data line.

Figure 7:
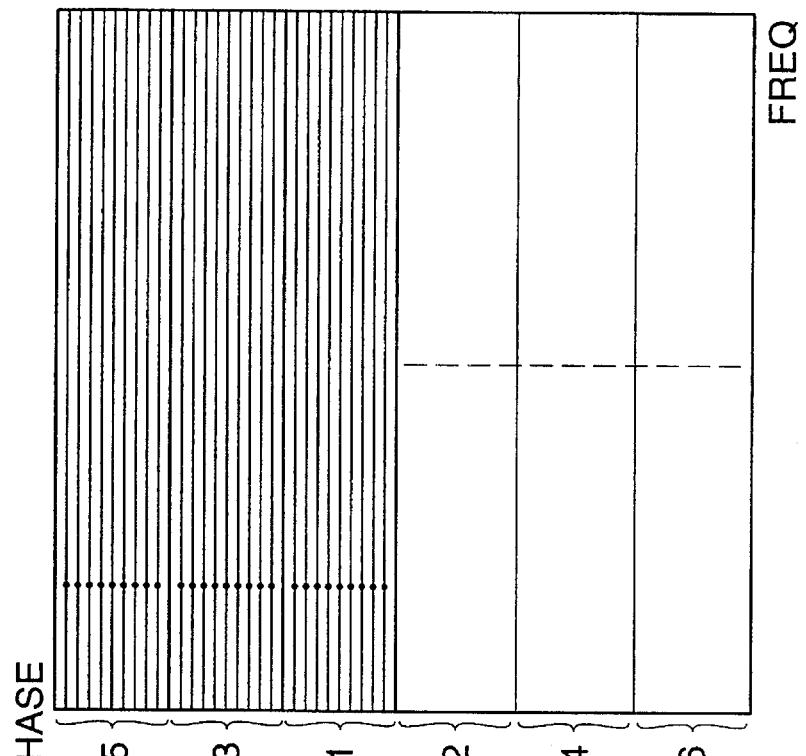
FIG. 7 illustrates a trajectory through k-space when using the predictive technique of FIG. 6.
Figure 6:
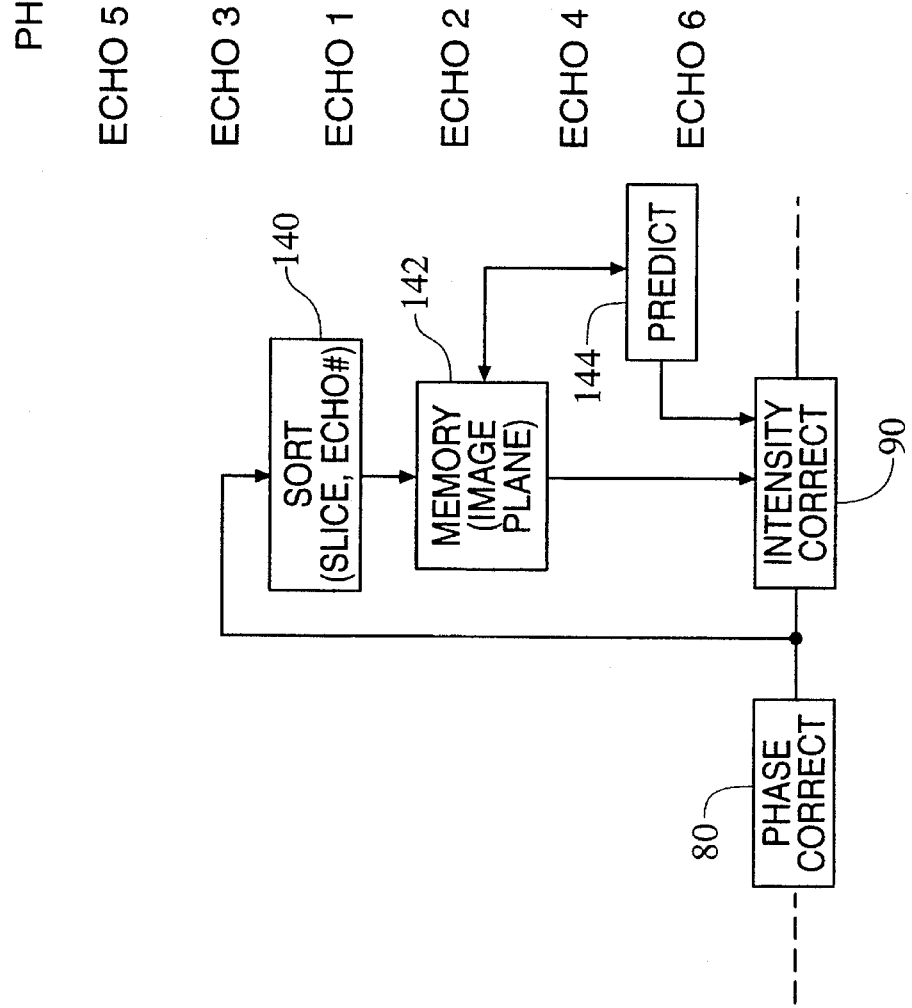
FIG. 6 illustrates and alternate embodiment of the intensity correction circuit using a predictive technique.

With reference to FIGS. 6 and 7, the intensity correction is generated in an alternate embodiment with a prediction technique. Each phase corrected data line from the phase correction processor 80 is conveyed to a sorter 140 that sorts the data lines by slice and echo number and stores them in a memory 142 by image plane. In the simplified example shown in FIG. 6, k-space is divided into six segments corresponding to the first, second, third, fourth, fifth, and sixth echo following each image excitation. Again, as discussed above, a much larger number of echoes is normally generated following each excitation. From the whole set of data lines, a prediction circuit 144 compares columns of corresponding data values from neighboring segments using a prediction model. The prediction model determines the model coefficients using the data values with an echo segment and predicts the next view amplitude. When the next echo is received, the accuracy of the prediction is determined and the prediction mechanics are adjusted to make the next predicted magnitude yet more accurate. In this manner, a magnitude correction for each data value of each data line by echo number is generated. The intensity correction circuit 90 multiplies each data value of each phase corrected data line by the corresponding predicted magnitude.

Figure 9:
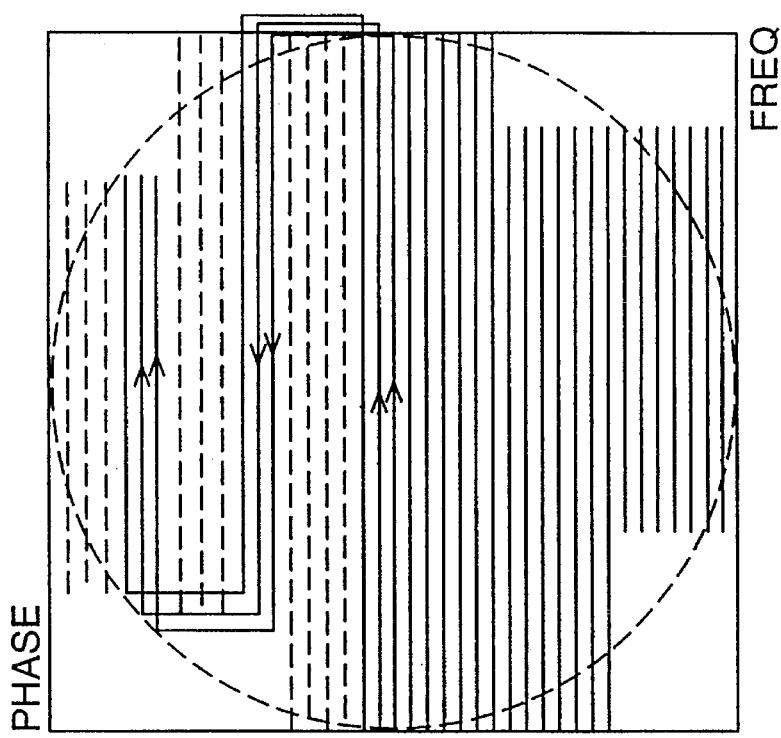
Figure 8:
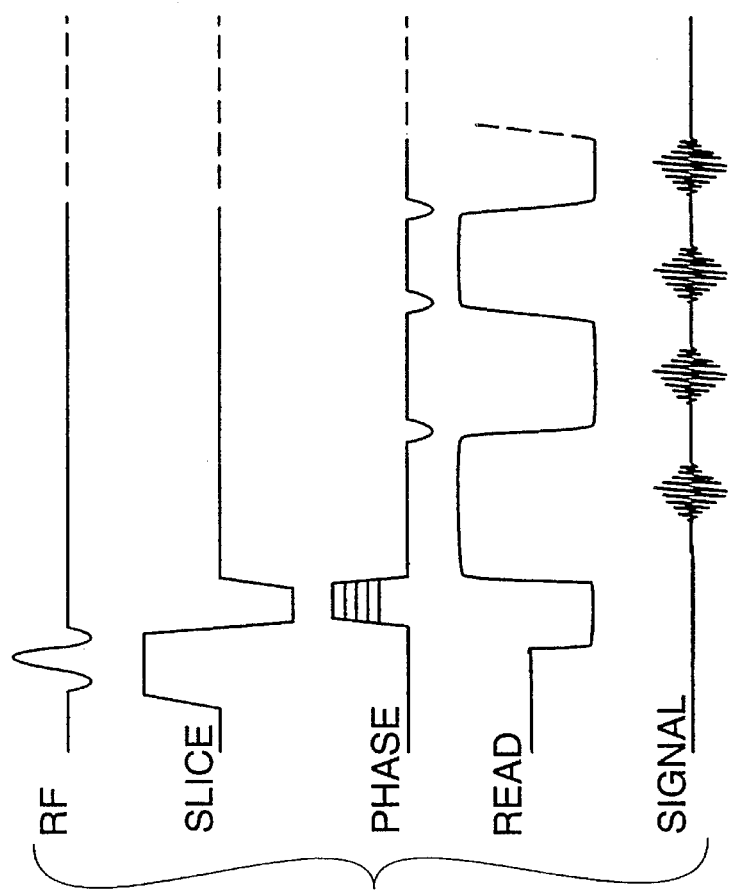
FIG. 8 illustrates an alternate embodiment of the read gradient in which the alternating read gradient pulses have progressively shorter durations; and, FIG. 9 illustrates the effect on the data lines in k-space caused by the shortening of the read gradient pulse widths segment by segment in k-space.

With reference to FIGS. 8 and 9, in another alternate embodiment, the read gradient pulses 60, 66, etc. have different temporal widths. When the duration of the read gradient is shortened, the effective length of the data line is shortened, but data collection is accelerated. In general, the data lines near the center of k-space are the most significant in image reconstruction with those at the far edges of k-space being less significant. The phase encoding gradient is applied relative to the read gradient such that the data lines in the segments of k-space closest to the center are taken with the longest read gradients, the data lines nearest the edges of k-space are taken with the shortest read gradients, and data lines in between are taken with progressively shorter read gradients. In this manner, a generally elliptical set of data lines are generated as illustrated in FIG. 9. For simplicity of processing, the empty spaces at the ends of the shorter data lines are filled with zeroes.

Looking now to the mathematics of the above-described process, the single shot echo-planar imaging offers an ultra-fast technique for true dynamic imaging in a subsecond time scale. In two-dimensional magnetic resonance imaging with multiple echoes, each selective excitation RF pulse induces magnetic resonance in a three-dimensional object in a field-of-view (FOV) with a proton nuclear spin density $\rho(x,y,z)$. An acquired induction signal or raw data line R is labeled by time t, a corresponding view $k_{pe}$, echo number q, slice number s, and shot number p, as:

$$R(t,p,q,s) = \int \rho(x,y,z) \delta (Z - s\Delta z) e^{i(G_{rd}Xt+\Delta B(x,y,z)T+\frac{2\pi k_{pe}Y}{FOV})-\frac{TE(q)}{T_2}} dxdydz, \quad (1)$$

where $G_{rd}$ is a time dependent magnetic field gradient (read-out) during data acquisition and $\Delta B(x,y,z)$ denotes main field inhomogeneity which includes the contribution of both magnet and susceptibility and TE(q) is the echo time of the q-th echo. The transverse spin relaxation is taken into account by $T_2$. Eddy current field effect is not included in Equation (1).

To speed up a multiple slice acquisition, a number of gradient or spin echoes are obtained following each excitation using an oscillatory read gradient or multiple refocusing RF pulses. Different echoes typically are phase encoded differently to obtain a plurality of differently phase encoded lines. Several schemes are contemplated in which for every excitation, more than one phase encoded line is obtained from the multiple echoes. The phase encoding follows a selected k-space trajectory in accordance with a set of gradient pulses on the phase encode axis. A subset of echoes is used as multiple phase encoding lines of an image slice with an effective echo time $E_n$ (or pseudo echo time).

$$R_{s,e_n}(k_{rd},k_{pe})=R(t,p,q,s), \quad (2a)$$

$$k_{pe}=k_{pe}(p,q), \quad (2b)$$

$$E_n = E_n(p,q)|_{k_{pe}} = 0, \quad (2c)$$

where $k_{pe}$ and $N_n$ are phase encoding step and pseudo echo number, respectively. The excitation or shot index p and the echo index q are described as:

$$p=1, \ldots, N_{shot}, \quad (3a)$$

$q = 1, \ldots, N_{echo}$, (3b)

where $N_{shot}$ denotes the number of excitations and $N_{echo}$ denotes the number of echoes. For a sequential phase encoding mapping scheme, the number of phase encoding steps is related to the number of k-space segments in the phase encode direction by:

$N_{pe} = N_{shot} N_{seg}$, (4a)

and the number of pseudo echoes $N_{pseudo\ echo}$ is given by:

$N_{pseudo\ echo} = N_{echo}/N_{seq}$ (4b).

The phase encoding mapping is generated as a one to one mapping table between $(p,q)$ and $(K_{pe}, E_n)$. The waveform of the read gradient pulse for frequency encoding can be any of numerous conventional appropriate shapes such as trapezoidal or sinusoidal. The data is preferably sampled continuously during the oscillation period of the read out gradient and divided into the multiple data lines. Due to the rise time constraint of the gradient system, the read out gradient is typically non-constant in shape during the entire window of data sampling. The data lines acquired in such a fashion are adjusted prior to Fourier transform to compensate for this non-constant shape.

The digital sampled data M is described as:

$$M_{sampled}(k) = M(k) \cdot \sum_i \delta(k - k_i) \qquad (5)$$
$$= M(k) \cdot S(k)$$

where $k_i$ denotes the k-value at which the i-th data sampling occurs. In the preferred regridding process performed by the regridding processor 70, the non-linear sampled raw data is interpolated to a set of linear sampled raw data on a set of uniform spaced grid points. The non-uniform raw data is convolved with a proper kernal function C(k), weighted and spread from acquired trajectory to a set of uniform spaced grid lattice points denoted by G(k). The values at all lattice points are accumulated. The actual interpolated raw data on a uniformly spaced lattice grid is given by:

$$M_{grid}(k) = \frac{M_{sampled}(k) \otimes C(k)}{d(k)} G(k), \qquad (6)$$

where D(k) is a continuous sampling density function, $\otimes$ represents a convolution operator, and:

$$M_{sampled}(k) = \sum_i M_i \delta(k - k_i), \qquad (7a)$$

$$D(k) = S(k) \otimes C(k), \qquad (7b)$$

where the sampling function S(k) and grid function G(k) are given by:

$$S(k) = \sum_i \delta(k - k_1), \qquad (8a)$$

$$G(k) = \sum_j \delta(k - j\Delta) \qquad (8b)$$

where $\Delta$ is the spacing between two nearest points on the uniform k-space grid lattice. C(k) is chosen to be an interpolation kernal which introduces minimum blurring in the image.

In order to combine multiple phase encoded data lines acquired from different echoes obtained at various echo times into a single data area and to form an image free of artifacts, the data is not only regridded, but also phase corrected. If the data sampling interval is uniform and the read gradient is constant during such sampling window, regridding is not necessary. To reconstruct an image with a two-dimensional Fourier transform without artifacts, the data from the different echoes are time shifted and phase corrected before the last Fourier transform along the phase encoding direction.

The acquired data lines are filtered and sampled in the sampling time or row direction by the first array processor 72. The one-dimensional Fourier transforms are performed in the order the data lines are received:

$$R(X,p,q,s) = FT_t\{r(t,p,q,s)\} = \qquad (9)$$
$$\int \rho(x,y,z)\delta(Z - s\Delta z) e^{i\left(\frac{2\pi k_{pe} Y}{FOV}\right)} dxdydz,$$

where $FT_t$ denotes a discrete Fourier transform along a data sampling time (t) direction. The phase correction circuit 80 phase corrects each one-dimensional Fourier transformed data line for each scene as:

$$R^c(x,p,q,s) = R(X,p,q,s)\{\hat{C}(X,q,s)\}^*, \qquad (10)$$

where the complex unitary correction vectors $\hat{C}$ are constructed as:

$$R_f(X,q,s) = FT_t\{r(t,q,s) \cdot f_L(t)\}, \qquad (11a)$$

where $r(t,q,s)$ denotes the calibration raw data corresponding to zero phase encode of echo q and slice s, and where $f_L(t)$ is a low pass filter, and:

$$\hat{C}(X,q,s) = \frac{R_f(X,q,s)}{|R_f(X,q,s)|}. \qquad (11b)$$

Preferred low pass filters include Gaussian, Hanning, Blackman, or the like which center the peak position of the raw data. The low frequency filter can be as general as a n-term cosine expansion formula. The correction data is smoothed with this filter to reduce noise in the phase value to be determined. The resultant correction phase array includes DC, linear, and high order components. In discrete form, the complex correction vector a time $t_j$ is:

$$c(t_j) = e^{i\phi_j}, \qquad (12a)$$

$$j = 1, \ldots, N_x, \qquad (12b)$$

where $\phi_j$ is the phase error and is assumed to be a relatively smooth function.

The corrected data is then sorted corresponding to different pseudo echoes and Fourier transformed along the second dimension, i.e., the phase encoding direction by the second array processor 98 as:

$$R^c(X,p,q,s) = R'(X,k_y,E_n), \qquad (13a)$$

$$im(x,y,E_n) = FT_{k_y}\{R'(X,k_y,E_n)\}, \qquad (13b)$$

where $im(x,y,E_n)$ represents a final image of pseudo echo $E_n$. In the sorting processes, the k-space segments can be shared with different pseudo echoes.

The phase correction vector $\hat{C}$ is determined prior to image data acquisition by running a series of calibration data lines. Alternately, the calibration data lines can be accumulated after imaging or intermixed among the segments of the multi-shot imaging procedure. To reduce the memory requirement for temporary storage of these correction vectors for an optimal computation efficiency, the length of the correction vectors is shortened 110 by at least a factor of two at the raw data level. With a shorter length of calibration raw data line, the length for the correction vector is shortened as well for purposes of saving memory. For the case of the factor of two reduction, before the final phase correction, a simple interpolation 120 is performed to match the lengths of the complex data lines and the correction vectors as follows:

$$\phi_j, \phi_{j+1} \tag{14}$$
$$\phi_{j+\frac{1}{2}}$$

$$\frac{e^{i\phi_j} + e^{i\phi_{j+1}}}{2} =$$

$$e^{i(\phi_j + \phi_{j+1})/2} \cos\left(\frac{\phi_j - \phi_{j+1}}{2}\right).$$

The unitary complex correction vector at the intermediate point is:

$$C_{j+1/2} = \frac{e^{i\phi_j} + e^{i\phi_{j+1}}}{|e^{i\phi_j} + e^{i\phi_{j+1}}|} = \frac{C_j + C_{j+1}}{|C_j + C_{j+1}|}, \tag{15a}$$

$$= e^{i(\phi_j + \phi_{j+1})/2}. \tag{15b}$$

Alternately, a reduced length calibration data line can be zero-filled to the proper length and then Fourier transformed.

When acquiring the calibration data, the circuit 124 determines whether sufficient correction data lines have been collected to give a signal-to-noise ratio with a preselected confidence level. The signal-to-noise of the calibration data is related to the number of averages as:

$$S/N \propto \sqrt{nsa}, \tag{16a}$$

$$N \propto \frac{1}{\sqrt{nsa}}. \tag{16b}$$

The reliability or confidence of an estimated value of interest, such as signal level and signal-to-noise, is tested in the preferred embodiment according to the student T test. For a set of samples obtained as $X_i$, i=1, ..., n, with a mean of $\mu_0$ and a variance of $\sigma^2$, and $\mu$ denotes an estimate of $\mu_0$. If n is large, e.g., greater than 30, then T has approximately a normal distribution:

$$T = \frac{\mu - \mu_0}{\sigma/\sqrt{n}}, \tag{17}$$

where $\mu$ denotes the mean of sampled X and n is the degree of freedom.

The variation in this expression is roughly determined from a single calibration scan using the data furthest from the echo center. For a preselected confidence level of $\mu$ with a confidence coefficient of 1-$\alpha$, the interval is:

$$\mu_0 \pm t_{\alpha/2} \frac{\sigma}{\sqrt{n}}, \tag{18}$$

where $t_{\alpha/2}$ is a value for a rejection region corresponding to a confidence level of $\alpha$%, which is looked-up in a T-test table. The T-test can be used in various ways. In one way, a one-sided confidence interval test for $\mu$ is performed. In this example, $\mu$ is a measure of signal-to-noise ratio for a multiple shot scan. The test uncertainty ratio $\mu > \mu_0$ for a given confidence coefficient 1-$\alpha$ is:

$$T = \frac{\mu - \mu_0}{\sigma/\sqrt{n}} > -t_\alpha. \tag{19}$$

The $T_2$ signal decay causes a signal intensity variation from echo-to-echo. An intensity correction 90 is preferred, but may not be necessary when the k-space order is a monotonic function of signal decay. In the preferred intensity correction technique, a standard linear predictive (LP) method is employed along the phase encode direction as:

$$\hat{x}_n^f = \sum_{i=1}^{p} f_i x_{n-i}, \tag{20a}$$

$$\hat{x}_n^b = \sum_{i=1}^{q} b_i x_{n+i}, \tag{20b}$$

$$J = \sum_{n \in B} |\hat{x}_n - x_n|^2, \tag{20c}$$

where $\{x_i\}$ are a set of complex data values from one of the segments along a column direction, $$\hat{x}_n^f \text{ and } \hat{x}_n^b$$

are forward and backward predicted values, respectively, and where $f_i$ and $b_i$ are two model coefficients, parameter p and q denote the order of the forward and backward LP methods respectively, and B denotes a set of the measured points within a k-space segment. To determine these model coefficients $\{f_i \text{ and } b_i\}$, an error function J is minimized using the data available within each segment. At the boundary of the segments, both forward and backward prediction expressions are used to predict the data into the other segment. The comparison between the prediction and the data available allows an easy way to determine an intensity ratio and phase difference between two neighboring k-space segments:

$$\hat{x}_n^f \text{ or } \hat{x}_n^b \sim x_n. \tag{21}$$

In a preferred multiple shot echo-planar imaging technique, the collection and phase correction sequence for a 2D multi-slice acquisition is as follows. Calibration data, all with 0-th phase encoding, are collected for each echo and slice. The data is smoothed with a Gaussian filter 112 along the read direction. A one-dimensional Fourier transform 72 is performed on the data in each row in the read out direction. Correction vectors from these one-dimensional Fourier transformed calibration lines are generated and stored in memory 118. Imaging data is acquired shot by shot and slice by slice. The imaging data is subject to the one-dimensional Fourier transform 72. Each data line is corrected 80 with the calibration data by multiplying each row of data by the complex correction vector.

Looking now to the intensity correction of the preferred embodiment, each once Fourier transformed calibration complex data line $R_i(q)$ for each echo q is used to generate an intensity correction factor based on the echo number q as:

$$\gamma_q = \frac{\sqrt{\sum_{i=0}^{N_P-1} R_i(q_0) \cdot R_i^*(q_0)}}{\sqrt{\sum_{i=0}^{N_P-1} R_i(q) \cdot R_i^*(q)}}, \tag{22}$$

where i is the pixel index along the read-out direction and $q_0$ is a reference echo, preferably an echo corresponding to the center segment of k-space. A low pass filter $f_j$ along a phase encoding or j-direction of k-space is defined as:

$$f_j = e^{-\frac{(j-j_0)^2}{2\delta^2}}, \quad (23a)$$

$$j = 1, \ldots, N_V, \quad (23b)$$

where j denotes the view index, $j_0$ is the center view index, and $\delta$ is a filter width parameter.

A combined global intensity correction factor ($\eta_j$) along phase encoding direction (j) is:

$$\eta_j = \gamma_{q(j)} f_j, \quad (24a)$$

$$j = 1, \ldots, N_v, \quad (24b)$$

where j denotes the phase encoding step index. In the intensity correction step 90, each previously phase corrected data line is intensity corrected as follows:

$$R_{s,E_n}^{int}(x,j) = R'_{s,E_n}(X,k_y)\eta. \quad (25)$$

It will be appreciated that the phase and intensity corrections can be performed in a single step. The final complex image $im_{s,E_n}(x,y)$ is obtained with a column one-dimensional Fourier transform 100 along the phase encoding direction:

$$R_{s,E_n}^{int}(x,k_y) = R_{s,E_n}^{int}(X,j), \quad (26a)$$

$$im_{s,E_n}(x,y) = FT_{k_y}\{R_{s,E_n}^{int}(X,k_y)\}, \quad (26b)$$

where s is a slice index and $E_n$ is a pseudo echo.

The present invention will also find application in conjunction with other techniques. For example, the invention may also be used with multi-shot echo-planar imaging with one or more prepulse preparation routines. The calibration data can be obtained by setting a prepulse amplitude to zero while keeping all gradient activities for the prepulse unchanged. The invention is also applicable to diffusion imaging. The calibration data is obtained for all diffusion gradient pulse steps used in the imaging acquisition with the phase encoding gradient OFF. In PCA and flow imaging, the same gradient activities are performed in an interleaved style with the phase encode gradient zeroed. In cine cardiac imaging, the calibration data is obtained from any one of the cardiac phases. The same correction vector is applied in each temporal phase. The calibration can also be obtained at all temporal positions. In a multiple shot echo-planar imaging in an up-take study, the calibration scan is performed once at the beginning of a set of time course multiple shot echo-planar imaging acquisitions. With a phased array acquisition, the calibration data lines are acquired simultaneously from all radio frequency receive channels. The images corresponding to individual coils are reconstructed separately and then combined to produce the final composite image. The calibration scanning can be done at the beginning as well as at the end of an imaging acquisition or simply interleaved within the imaging acquisition. The calibration data can also be used for motion correction.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a magnet for generating a temporally constant magnetic field through an examination region, a radio frequency pulse controller and digital transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region and for repeatedly reversing the read gradient, a receiver for receiving and demodulating the radio frequency magnetic resonance signals after each reversal of the read gradient to produce a series of data lines, and an image memory for storing a reconstructed image representation, the improvement comprising:

a regridding processor for adjusting each data line for uniformity in a read direction of k-space;

a first array processor for performing a one-dimensional Fourier transform in the read direction on each regridded data line;

a high order phase correction vector multiplier for multiplying each Fourier transformed data line by a phase correction vector, the high order being at least second order; and, a second array processor for Fourier transforming the phase corrected data lines in a phase encode direction into the image memory.

2. In the magnetic resonance imaging system as set forth in claim 1, the improvement further comprising:

the phase correction vector being spatially dependent in a slice direction for multiple slice imaging.

3. In the magnetic resonance imaging system as set forth in claim 1, the improvement further comprising:

the phase correction vector being volume dependent for volumetric imaging.

4. In the magnetic resonance imaging system as set forth in claim 1, the improvement further comprising:

an intensity correction processor for adjusting an amplitude of each phase corrected data line.

5. In the magnetic resonance imaging system as set forth in claim 1, the improvement further comprising:

a system for generating the phase correction vectors including:

a system for generating a plurality of unit vectors from calibration data lines with zero phase encoding;

a complex conjugate processor for determining a complex conjugate vector of each unit vector to generate the phase correction vectors; and, a correction vector memory for storing the phase correction vectors for each of a plurality of data lines.

6. In the magnetic resonance imaging system as set forth in claim 5, the improvement further comprising:

the reconstructed image representation representing a first plurality of slices and the calibration vectors being generated from a second plurality of slices, the second plurality being smaller than the first plurality, and further including an interpolator for interpolating phase correction vectors into other slices.

7. In the magnetic resonance imaging system as set forth in claim 5, the improvement further comprising the correction vector generator circuit including:

a trimming circuit for shortening each calibration data line prior to generating the unit vectors such that the unit vectors and the phase correction vectors are shorter than the data lines;

an interpolating circuit for interpolating the phase correction vectors to a common length with the data lines.

8. In the magnetic resonance imaging system as set forth in claim 5, the improvement further comprising the phase correction vector generating circuit including:

a filtering circuit for smoothing each calibration data line.

9. In the magnetic resonance imaging system as set forth in claim 5, the improvement further comprising:

a means for fitting the phase correction vector to a polynomial of at least second order.

10. In the magnetic resonance imaging system as set forth in claim 5, the improvement further comprising an intensity correction processor including:

a circuit for determining a magnitude of each calibration data line;

a magnitude memory for storing magnitudes of the calibration data lines;

an averaging circuit connected with the magnitude memory for determining an average magnitude of the calibration data lines corresponding to a common echo number; and, a ratio circuit for determining a ratio of the average magnitude for each number and a preselected reference value, the ratio being conveyed to the intensity correction processor for correcting the intensity of phase corrected data line of the common echo number.

11. In a method of magnetic resonance imaging in which a radio frequency excitation pulse excites magnetic resonance in selected dipoles and in which the induced resonance is caused to form a plurality of echoes following each excitation, the echoes being read out along a first axis in the presence of a read gradient, each magnetic resonance echo being digitized and demodulated to form a digital data line for reconstruction into an image representation in an image memory, the improvement comprising:

adjusting each data line for uniformity in a frequency encode direction of k-space;

one-dimensionally Fourier transforming each data line in the frequency encode direction;

correcting each data line with a high order phase correction vector and loading the phase corrected data lines into a data line memory;

Fourier transforming data from the data line memory in a phase encode direction into the image memory.

12. In the magnetic resonance method as set forth in claim 11, the improvement further comprising:

applying a radio frequency excitation pulse to induce magnetic resonance and causing the magnetic resonance to reform into a plurality of sequential calibration echoes;

one-dimensionally Fourier transforming each calibration data line;

generating a unit vector from each one-dimensionally Fourier transformed calibration data line;

forming a complex conjugate vector from each unit vector;

storing the complex conjugate vectors in accordance with echo number following the RF excitation pulse;

during imaging, multiplying each data line with a corresponding one of the stored complex conjugate vectors.

13. In the magnetic resonance imaging method as set forth in claim 12, the improvement further comprising:

repeating the calibration sequence a plurality of times;

determining a signal-to-noise ratio of each data line in each repetition of the calibration process;

determining a distribution of signal-to-noise ratios by echo position over the plurality of repetitions of the calibration sequence;

for each calibration data line, statistically analyzing the distribution of signal-to-noise ratios to determine a confidence value that the calibration sequence has been run a sufficient number of times;

when the confidence level reaches a preselected level, terminating repetition of the calibration sequence.

14. In the method as set forth in claim 12, the improvement further comprising:

filtering each calibration data line with a smoothing filter.

15. In the method as set forth in claim 12, the improvement further comprising:

reducing a number of data values in each calibration data line such that each complex conjugate vector has a reduced number of data values;

expanding each complex conjugate vector prior to the multiplying step.

16. In the method as set forth in claim 15 wherein reducing the number of data values in each calibration data line includes deleting edge data values and retaining central data values.

17. In the method as set forth in claim 11, the improvement further comprising:

alternating a polarity of read gradient pulses for each echo, the read gradient pulses having a plurality of durations.

18. In the method as set forth in claim 11, the improvement further comprising:

storing a set of phase-corrected data lines for each of a plurality of segments of k-space;

as each k-space segment is filed, predicting a complex value of a next phase corrected data line with a prediction algorithm;

correcting a magnitude of the next phase corrected data line in accordance with the predicted complex value.

19. The method as set forth in claim 18 further including:

reading the actual complex value of the next data line;

comparing the actual complex value and the predicted complex value;

adjusting the prediction algorithm in accordance with the difference between the actual and predicted complex values.

20. In the magnetic resonance imaging method as set forth in claim 12, the improvement further comprising:

determining an average magnitude of the calibration data lines in accordance with echo number;

determining a ratio between an average magnitude of the data line corresponding to a first echo following excitation and a magnitude of data lines corresponding to each subsequent echo number;

correcting the intensity of each phase corrected data line in accordance with an inverse of the ratio of a corresponding echo number.

21. In the method as set forth in claim 11, the improvement further comprising:

generating a plurality of sets of calibration data lines, the calibration data lines of each set being indexed by temporal displacement from the excitation of resonance, each set of calibration data lines being phase encoded with one of a plurality of phase encodings adjacent a central region of k-space.

* * * * *